United States Patent
Ho et al.

(10) Patent No.: US 9,786,569 B1
(45) Date of Patent: Oct. 10, 2017

(54) OVERLAY MEASUREMENT AND COMPENSATION IN SEMICONDUCTOR FABRICATION

(71) Applicant: Taiwan Semiconductor Manufacturing Co., Ltd., Hsin-Chu (TW)

(72) Inventors: Wei-De Ho, Hsinchu (TW); Shu-Hong Lin, Hsinchu (TW); Ya Hui Chang, Hsinchu (TW); Chih-Jung Chiang, Hsin-Chu (TW); Chang-Yi Tsai, New Taipei (TW); Tsung-Lin Yang, Pingtung County (TW); Kuei-Shun Chen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/334,912

(22) Filed: Oct. 26, 2016

(51) Int. Cl.
  *H01L 21/00* (2006.01)
  *H01L 21/66* (2006.01)
  *H01L 23/544* (2006.01)
  *H01L 21/027* (2006.01)

(52) U.S. Cl.
  CPC ........... *H01L 22/20* (2013.01); *H01L 21/027* (2013.01); *H01L 23/544* (2013.01); *H01L 2223/54426* (2013.01)

(58) Field of Classification Search
  CPC ...... H01L 22/20; H01L 23/544; H01L 21/027
  See application file for complete search history.

(56) References Cited

U.S. PATENT DOCUMENTS

| 6,610,448 | B2 | 8/2003 | Sato et al. |
| 7,230,703 | B2 * | 6/2007 | Sezginer ............... G01B 11/26 356/401 |
| 8,716,841 | B1 | 5/2014 | Chang et al. |
| 8,736,084 | B2 | 5/2014 | Cheng et al. |
| 8,837,810 | B2 | 9/2014 | Chen et al. |
| 9,129,974 | B2 | 9/2015 | Hsieh et al. |
| 9,207,545 | B2 | 12/2015 | Huang |

(Continued)

OTHER PUBLICATIONS

Ching-Huang Chen et al., U.S. Appl. No. 14/868,532, filed Sep. 29, 2015, for "Lithography Alignment Marks", 20 pages of text, 8 pages of drawings.

*Primary Examiner* — Richard Booth
(74) *Attorney, Agent, or Firm* — Haynes and Boone, LLP

(57) ABSTRACT

A method includes receiving a device having a first layer and a second layer over the first layer, the first layer having a first overlay mark. The method further includes forming a first resist pattern over the second layer, the first resist pattern having a second overlay mark. The method further includes performing a first overlay measurement using the second overlay mark in the first resist pattern and the first overlay mark; and performing one or more first manufacturing processes, thereby transferring the second overlay mark into the second layer and removing the first resist pattern. The method further includes performing one or more second manufacturing processes that include forming a third layer over the second layer. After the performing of the one or more second manufacturing processes, the method includes performing a second overlay measurement using the second overlay mark in the second layer and the first overlay mark.

20 Claims, 8 Drawing Sheets

(56) References Cited

U.S. PATENT DOCUMENTS

| | | | |
|---|---|---|---|
| 9,304,403 B2 | 4/2016 | Lin et al. | |
| 9,653,404 B1 * | 5/2017 | Wang | .................... H01L 23/544 |
| 2009/0291513 A1 | 11/2009 | Ghinovker et al. | |
| 2010/0005442 A1 | 1/2010 | Ghinovker et al. | |
| 2012/0308112 A1 | 12/2012 | Hu et al. | |
| 2013/0201461 A1 | 8/2013 | Huang et al. | |
| 2013/0259358 A1 | 10/2013 | Chen et al. | |
| 2014/0101624 A1 | 4/2014 | Wu et al. | |
| 2014/0111779 A1 | 4/2014 | Chen et al. | |
| 2014/0119638 A1 | 5/2014 | Chang et al. | |
| 2014/0123084 A1 | 5/2014 | Tang et al. | |
| 2014/0226893 A1 | 8/2014 | Lo et al. | |
| 2014/0253901 A1 | 9/2014 | Zhou et al. | |
| 2014/0256067 A1 | 9/2014 | Cheng et al. | |
| 2014/0257761 A1 | 9/2014 | Zhou et al. | |

\* cited by examiner

|  | Previous layer compensation Value ($P_n$) | Process-induced OVL shift ($E_n$) | Estimated exposure-tool-induced OVL shift ($F_n'$) | Current layer compensation value ($C_n$) | Exposure-tool-induced OVL shift ($F_n$) |
|---|---|---|---|---|---|
| $L_1$ (reference) | $P_1 = 0$ | $E_1 = 0$ | $F_1' = 0$ | $C_1 = 0$ | $F_1 = 0$ |
| $L_2$ | $P_2 = 0$ | $E_2$ | $F_2'$ | $C_2 = P_2 + E_2 + F_2'$ | $F_2$ |
| $L_3$ | $P_3 = (P_2 + E_2 + F_2')$, or $P_3 = (P_2 + E_2 + F_2)$ | $E_3$ | $F_3'$ | $C_3 = P_3 + E_3 + F_3'$ | $F_3$ |
| $L_4$ | $P_4 = (P_3 + E_3 + F_3')$, or $P_4 = (P_3 + E_3 + F_3)$ | $E_4$ | $F_4'$ | $C_4 = P_4 + E_4 + F_4'$ | $F_4$ |
| ... | ... | ... | ... | ... | ... |

500

The order of layer formation

Fig. 5

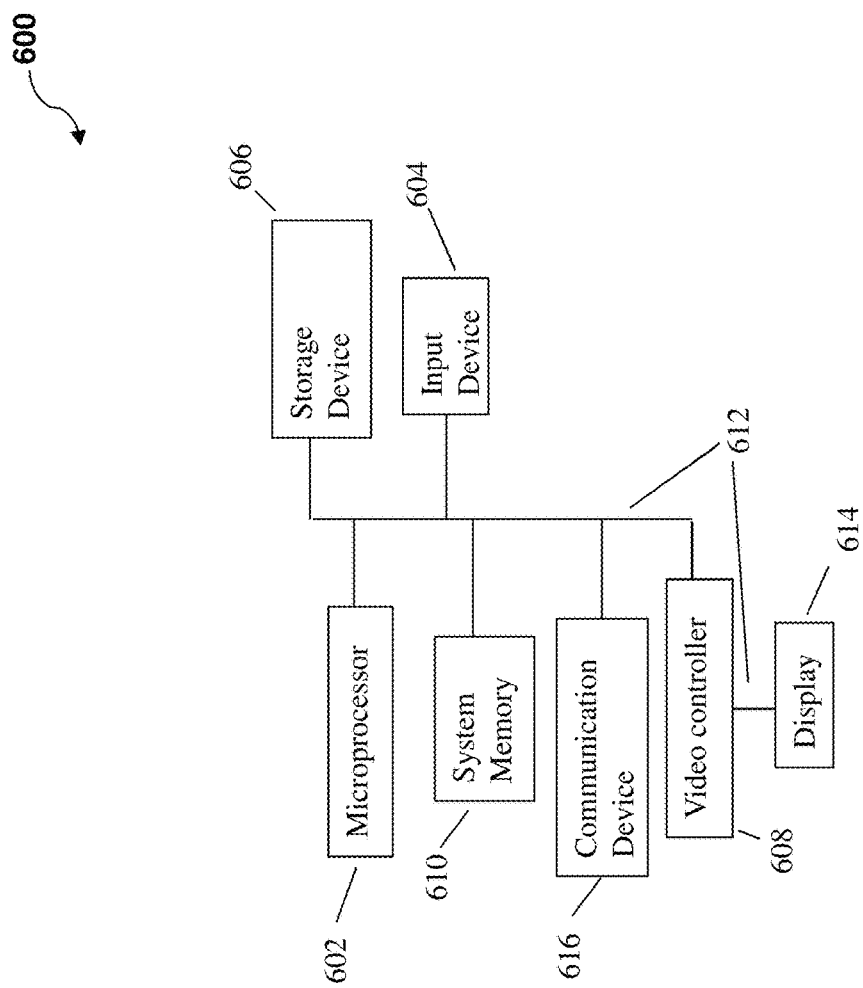

OVERLAY MEASUREMENT AND COMPENSATION IN SEMICONDUCTOR FABRICATION

BACKGROUND

Semiconductor integrated circuit (IC) fabrication involves forming layers of patterns on a semiconductor wafer. Each layer has to be aligned with previous layer(s) such that the IC can function properly. Various marks, such as alignment marks and overlay marks, can be used for aligning the layers. In addition, overlay marks are also used for monitoring overlay deviation between layers. Overlay deviation includes misalignment in the position, size, and shape between overlay marks at successive layers. Overlay mark misalignment may be caused by various factors such as aberration and focus position of the projection optical system when transferring patterns from a photomask to a wafer. In addition, fabrication processes such as etching and chemical mechanical polishing (CMP) are likely to affect overlay mark alignment as well.

As semiconductor technology continues progressing to smaller and smaller feature sizes, alignment requirements become more and more stringent. Accordingly, it is desirable to reduce or minimize overlay deviations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 5 illustrates overlay alignment deviation and compensation in an exemplary fabrication process constructed according to aspects of the present disclosure.

FIG. 6 illustrates a computer system for implementing one or more embodiments of the present disclosure.

DETAILED DESCRIPTION

Figure 1:
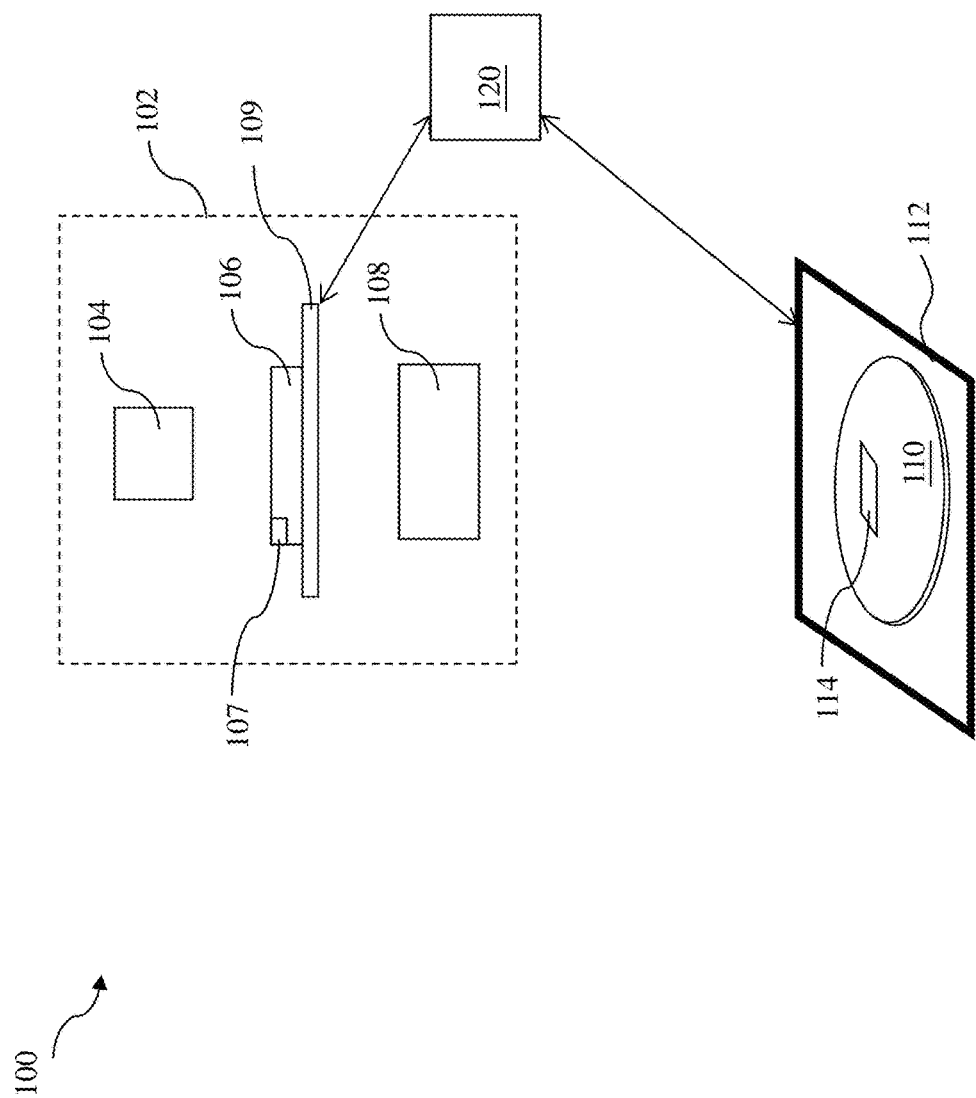
FIG. 1 is a simplified schematic diagram of a lithography system that may be used for performing some aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and fabrication. More particularly, the present disclosure is related to methods for fabricating semiconductor devices with reduced overlay shift (or overlay misalignment). According to embodiments of the present disclosure, certain overlay deviation is compensated when transferring IC patterns from a photomask (or mask or reticle) to a wafer in an exposure tool. The overlay compensation reduces total overlay shift.

FIG. 1 is a schematic view of a lithography system 100 constructed according to various aspects of the present disclosure in one or more embodiments. Referring to FIG. 1, the lithography system 100 includes an exposure sub-system 102 and an alignment sub-system 120. With reference to FIG. 1, the system 100 and the method of utilizing the same to expose circuit patterns and to check overlay shift are collectively described below.

Referring to FIG. 1, the exposure sub-system 102 is designed for performing a lithography exposure process to a resist layer coated on a target device 110 (such as a wafer), positioned on a substrate stage 112. In the following discussion, the target device 110 is also referred to as the wafer 110. When the exposed resist layer is further developed, various openings are formed in the resist layer, resulting in a resist pattern (or a patterned resist layer). The wafer 110 may be subsequently etched with the resist pattern as an etch mask, thereby forming features therein or thereon for an IC. In the present embodiment, the exposure sub-system 102 includes a radiation source 104 to provide radiation energy, and an optical module 108 that modulates the radiation energy by an image of a mask 106 and directs the modulated radiation energy to the resist layer coated on the wafer 110.

The radiation source 104 may be any radiation source suitable for exposing a resist layer. In various examples, the radiation source 104 may include a light source selected from the group consisting of ultraviolet (UV) source, deep UV (DUV) source, extreme UV (EUV) source, and X-ray source. For example, the radiation source 104 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the radiation source 104 is a EUV source having a wavelength of about 13.5 nm or less. In an alternative embodiment, the radiation source 104 is an electron beam (e-beam) source for exposing a resist layer by a proper mode, such as direct writing. In such a case, the mask 106 is not used during the exposing processes.

The optical module 108 may be designed to have a refractive mechanism or reflective mechanism. In a refractive mechanism, the optical module 108 includes various refractive components, such as lenses. In a reflective mechanism, the optical module 108 includes various reflective components, such as mirrors.

In an embodiment, the mask 106 includes a transparent substrate and a patterned absorption layer. The transparent substrate may use fused silica ($SiO_2$) relatively free of defects, such as borosilicate glass and soda-lime glass. The absorption layer may include a metal film such as chromium (Cr) for absorbing light directed thereon. The absorption layer is further patterned to have one or more openings in the metal film through which a light beam may travel without being completely absorbed. In another embodiment where the radiation source 104 generates EUV radiation, the mask 106 is designed to have reflective mechanism. For example, the mask 106 may include a substrate coated with tens of alternating layers of silicon and molybdenum to act as a Bragg reflector that maximizes the reflection of EUV light.

The mask 106 includes a mark 107, which may be an alignment mark or an overlay mark. An alignment mark is often used for aligning a wafer (e.g., the wafer 110) and a mask (e.g., the mask 106). An overlay mark is often used for measuring overlay deviations between two layers on a wafer (e.g., the wafer 110). In the present embodiment, the mark 107 is an overlay mark. The mask 106 is secured on a mask stage 109 which is configured to move such that the image of the mask 106 is projected onto a target area of the wafer 110. The overlay mark 107 is transferred to the wafer 110 and eventually becomes an overlay mark 114 in a layer of the wafer 110 through exposing, developing, etching, deposition, and other processes. The overlay mark 114 may be disposed in a cell region or a scribe line region of the wafer 110. The overlay mark 114 may be reflection-based or diffraction-based, and may have any suitable size, shape, and configuration, such as box-in-box, frame-in-frame, cross-in-box, box-in-bar, bar-in-bar, and diffraction gratings.

The alignment sub-system 120 is responsible for aligning the mask 106 relative to the mask stage 109, the wafer 110 relative to the substrate stage 112, and the mask 106 relative to the wafer 110. The alignment sub-system 120 may employ a coherent or incoherent light source (not shown) that is capable of emitting a visual light, an infrared light, a near-infrared (NIR) light, a far-infrared (FIR) light, a violet light, a ultra-violet (UV) light, or a combination thereof. The alignment sub-system 120 may further include optical components such as light polarizers, lens, mirrors, beam splitters, and/or fiber optics. The alignment sub-system 120 is configured to scan images of alignment marks and/or overlay marks on the wafer 110. Furthermore, the alignment sub-system 120 may be configured to perform alignment error or overlay error analysis. In an embodiment, the alignment sub-system 120 further includes a computer which calculates overlay shift, and use the calculated overlay shift to control the alignment of various components, such as the mask stage 109 and the substrate stage 112.

The lithography system 100 is used for exposing a resist layer coated on the wafer 110. The exposed resist layer is subsequently used for etching the wafer 110, as part of a fabrication process for forming a layer on the wafer 110 with IC patterns. The fabrication process may include etching, deposition, CMP, annealing, ion implantation, oxide growth, epitaxial growth, and/or other suitable processes. This repeats, layer by layer, for forming multiple layers on the wafer 110. The multiple layers have to be aligned with each other in order for the final IC to function properly. In this fabrication process, the overlay marks 114 play an important role as they are used for monitoring the overlay shift between successive layers. The monitored overlay shift can then be used (e.g., by the alignment sub-system 120) for adjusting the alignment of the mask 106 and the wafer 110 in subsequent exposure processes.

Overlay shift may arise from optical aberration, illumination asymmetry and variations, mask/substrate stage tilt and misalignment, and other asymmetries in the lithography system 100 (exposure-tool-induced overlay shift). Overlay shift may also arise from distortion caused by wafer fabrication processes, such as etching, CMP, sputtering deposition, and other processes (process-induced overlay shift). It would be advantageous to know the amount of overlay shift between a layer to be formed (new layer) and the underlying layer so that the new layer can be properly compensated when it is formed. Knowing the exact amount of this overlay shift is impossible because the new layer is yet to be formed. However, a close estimate of the amount of overlay shift is possible based on measurements on the existing layers and other wafer lots that have undergone the same manufacturing processes. This is termed overlay measurement and compensation, a subject of the present disclosure.

Figure 2:
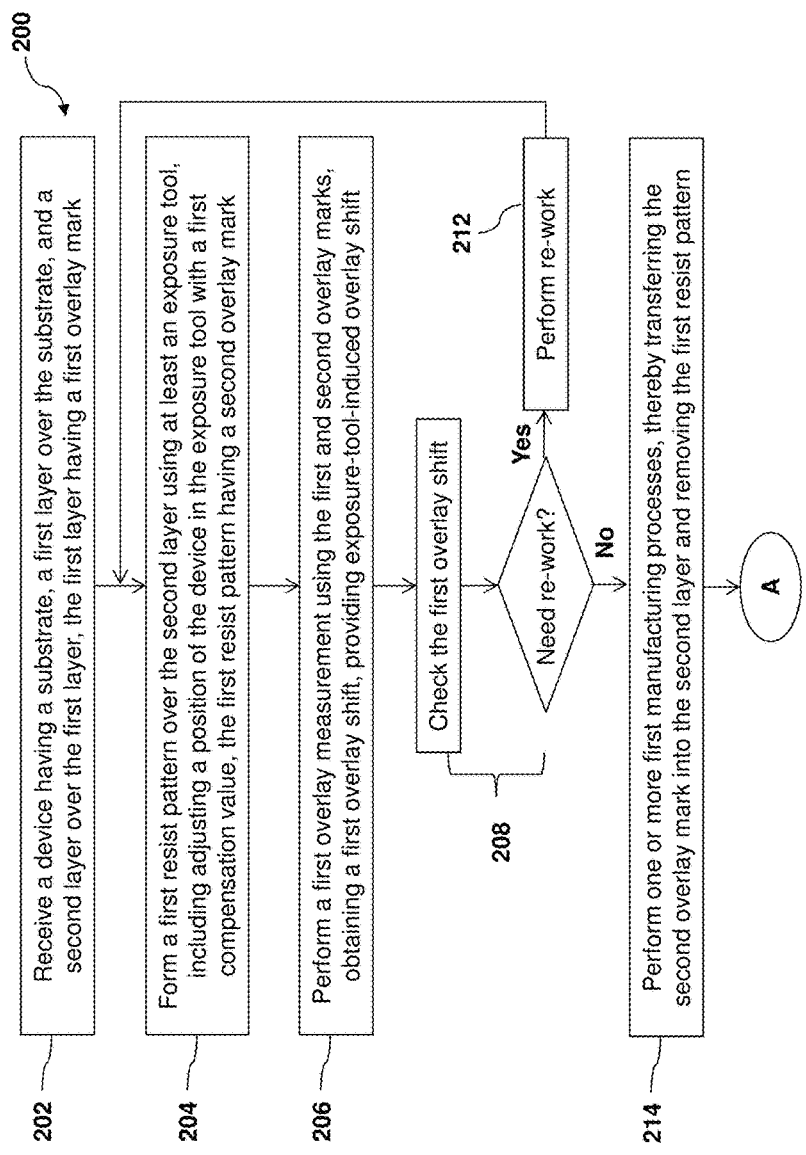
FIGS. 2 and 3 illustrate a flow chart of a method for semiconductor fabrication with reduced overlay shift, according to aspects of the present disclosure.
Figure 3:
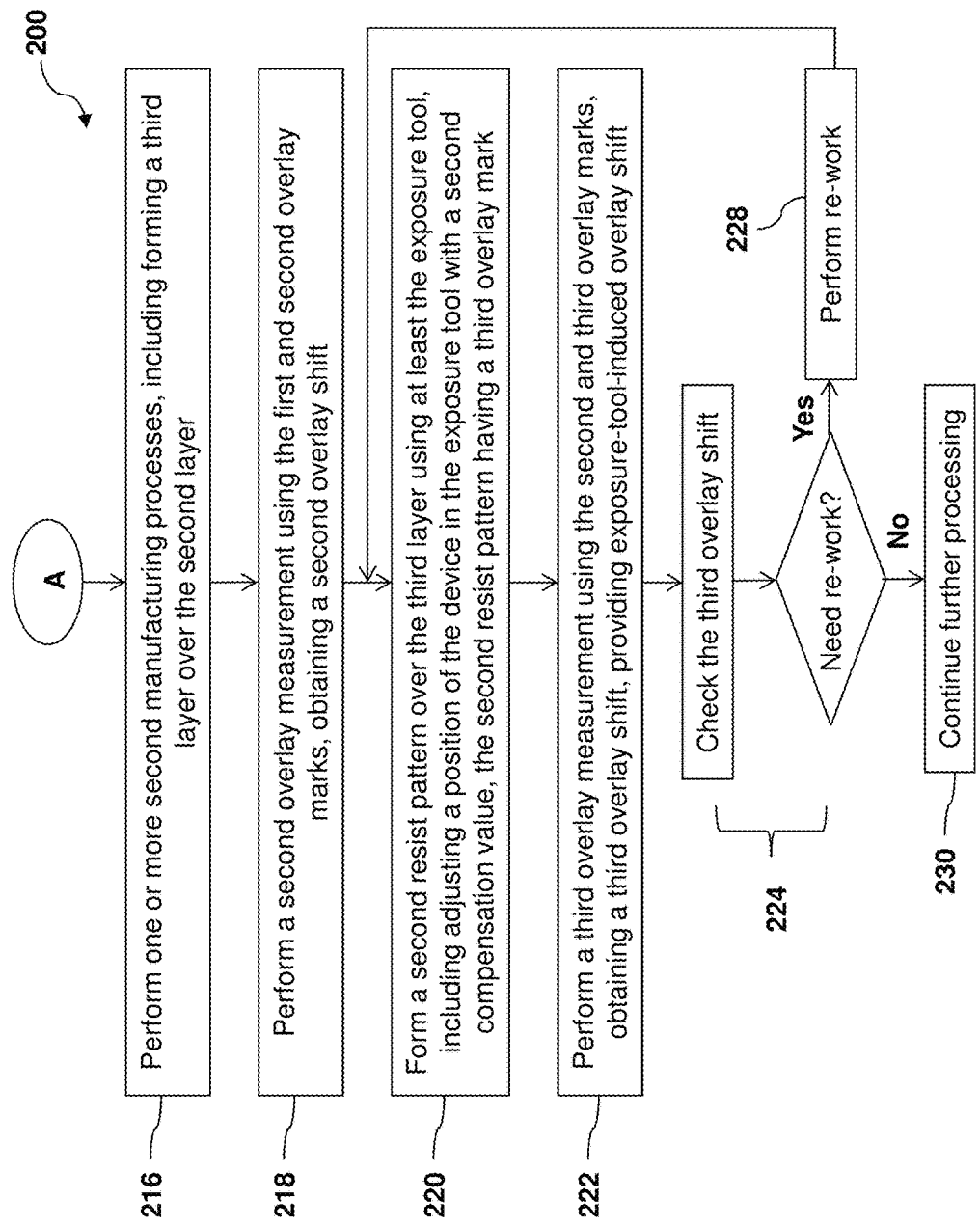

Referring to FIGS. 2 and 3, shown therein is a method of 200 for semiconductor fabrication, which employs techniques of overlay measurement and compensation, constructed according to aspects of the present disclosure. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is discussed in conjunction with the lithography system 100 above and FIGS. 4A-4G which illustrate cross-sectional views of a device 400 during various fabrication stages. The device 400 is formed with overlay marks for overlay measurement. The device 400 may be an intermediate device fabricated during processing of an integrated circuit (IC), or a portion thereof, that may comprise static random access memory (SRAM) and/or other logic circuits, passive components such as resistors, capacitors, and inductors, and active components such as field effect transistors (FET), FinFET, p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 4A:
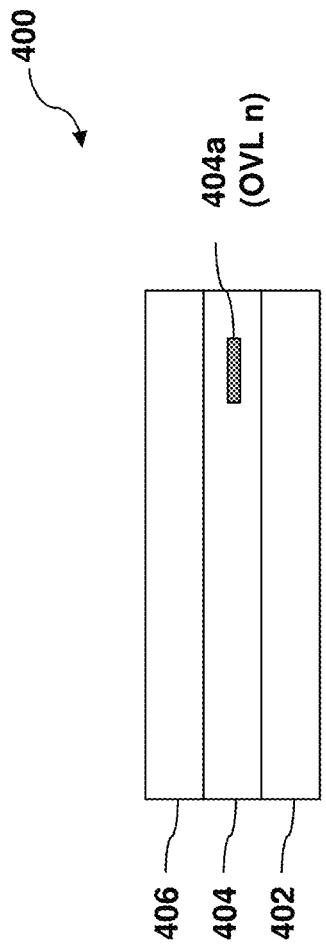
FIGS. 4A, 4B, 4C, 4D, 4E, 4F, and 4G are cross-sectional views of a portion of a semiconductor device during various stages of fabrication, in accordance with some embodiments.

Referring to FIG. 2, at operation 202, the method 200 receives the device 400 having a substrate 402, a layer 404 disposed over the substrate 402, and a layer 406 disposed over the layer 404, as illustrated in FIG. 4A.

The substrate 402 is a silicon substrate (e.g., a silicon wafer) in the present embodiment. Alternatively, the substrate 402 may comprise another elementary semiconductor such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 402 is a semiconductor on insulator (SOI). The substrate 402 may include doped regions, epitaxial features, and isolation regions.

The layer 404 may be an insulation layer, a semiconductor layer, or a metal layer (e.g., metal features embedded in a dielectric layer). For example, the layer 404 may include isolation features, semiconductor fin features, epitaxial features, transistor contact features, metal lines, and/or metal vias. In the present embodiment, the layer 404 is a metal layer, such as a layer having copper interconnect for connecting various active or passive components in the substrate 402. The layer 404 includes an overlay mark 404a, which has been formed into the layer 404 using apparatuses and processes, such as discussed with respect to FIG. 1. The various characteristics described with respect to the overlay mark 114 (FIG. 1) apply to the overlay mark 404a. The overlay mark 404a may be disposed in a chip area or a scribe line area of the layer 404. In an embodiment, the overlay mark 404a comprises a metal, such as copper, aluminum, or other suitable metals. For example, the overlay mark 404a may include metal lines embedded in a dielectric material such as an extreme low-k (ELK) dielectric material with a dielectric constant of 2.5 or less. There may be one or more layers between the layer 404 and the substrate 402, such as an etch stop layer, a low-k (k<3.9) dielectric layer, or other suitable material layers.

In the present embodiment, the layer 406 is a dielectric layer or a low-k dielectric layer, where metal features such as metal vias and metal lines are to be formed. There may be one or more layers between the layer 406 and the layer 404, such as an etch stop layer, a low-k dielectric layer, or other suitable material layers.

In the present embodiment, the overlay mark 404a is the n-th overlay mark in the device 400 in a sequential bottom-up order (starting from the substrate 402), where n is greater than or equal to 1. The following discussion focuses on overlay measurement between the (n+1)-th and n-th overlay marks, as well as between the (n+2)-th and (n+1)-th overlay marks. In this way, the discussion is simplified and the technique can be applied to any overlay mark in any layer of the device 400. In cases where n is greater than 1, an overlay shift between the n-th overlay mark 404a and the (n−1)-th overlay mark (not shown) underneath the layer 404 may be measured using an apparatus such as the alignment sub-system 120 of FIG. 1 or an overlay metrology tool. The overlay shift may include translational, rotational, and/or dimensional displacement between the n-th overlay mark 404a and the (n−1)-th overlay mark.

Figure 4B:
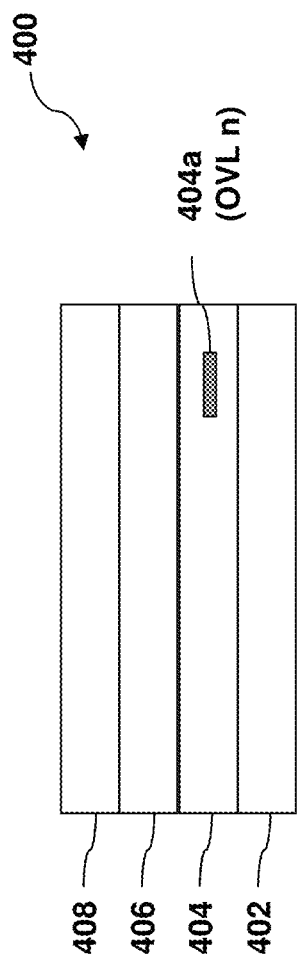
Figure 4C:
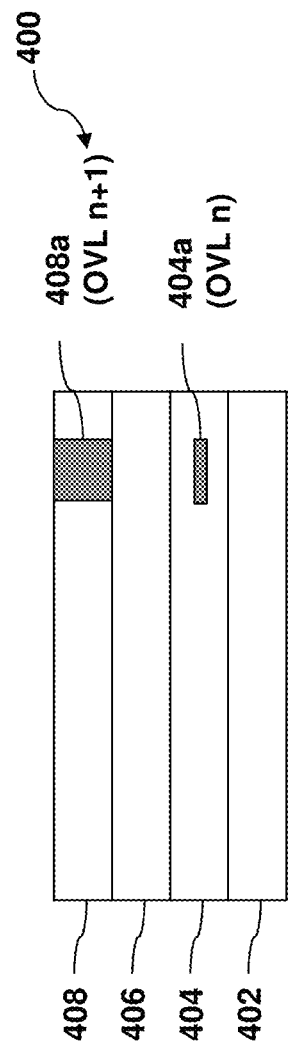

At operation 204, the method 200 (FIG. 2) forms a resist pattern 408 over the layer 406, wherein the resist pattern 408 has an overlay mark 408a (FIGS. 4B and 4C). This involves multiple processes as illustrated in FIGS. 4B and 4C. Referring to FIG. 4B, a resist layer 408 (not patterned yet) is formed over the layer 406 by one or more processes including resist coating and pre-baking in an embodiment. In an embodiment, one or more layers are formed between the layer 406 and the resist layer 408, such as a nitrogen-free anti-reflective coating (NFARC) layer, a hard mask (e.g., titanium nitride) layer, and/or an amorphous silicon layer. After the resist layer 408 is formed, the device 400 is placed in an exposure tool such as the lithography system 100 (e.g., replacing the wafer 110 with the device 400 in FIG. 1) for exposing an image onto the resist layer 408. The exposure tool aligns a mask (e.g., the mask 106) with the device 400 so that an exposed image in the resist layer 408 will be properly aligned with features in the layer 404, particularly the overlay mark 408a in the exposed image will be properly aligned with the overlay mark 404a.

In an embodiment, an overlay shift between the n-th overlay mark 404a and the (n−1)-th overlay mark (not shown) is used by the exposure tool (e.g., using the alignment sub-system 120 of FIG. 1) to adjust the alignment between the mask 106 and the device 400 during the above alignment process. The amount of adjustment is referred to as an overlay compensation value. The overlay compensation value may include translational, rotational, and dimensional components. For example, various layers of the device 400 correspond to various masks in a mask set. The alignment of the masks is defined with respect to a common reference in a base layer such as in the substrate 402. When the layer 404 has shifted due to exposure-tool-induced overlay shift and/or process-induced overlay shift, it is desirable to carry the same amount of overlay shift over to the subsequent layer (e.g., the layer 408) so that the layers 408 and 404 can be properly aligned. In the present embodiment, the overlay compensation value for the layer 408 includes the amount of the overlay shift between the n-th overlay mark 404a and the (n−1)-th overlay mark, and may further include an estimated exposure-tool-induced overlay. For example, the estimated exposure-tool-induced overlay shift may be obtained from other wafer lots that have undergone the same or substantially the same fabrication processes as the device 400. Those overlay shift values can be used as empirical data and be applied to the device 400. For example, if the empirical data indicates that the exposure tool typically introduces a translational shift of 2 nanometers (nm) to the right along the x-axis, the alignment sub-system 120 (FIG. 1) can pre-emptively apply a 2 nm shift to the left along the x-axis when aligning the wafer 106 and the device 400. This pre-emptive shift compensates the exposure-tool-induced overlay shift, partially or completely.

After the mask and the device 400 are aligned, the resist layer 408 is exposed to have a latent image. Subsequently, the device 400 is moved to other tools to undergo processes such as a resist post-exposure bake process and a resist developing process. As a result, part of the resist layer 408 is removed and the remaining part of the resist layer 408 forms a resist pattern, which is referred to as the resist pattern 408 for the convenience of discussion. The resist pattern 408 includes the overlay mark 408a (FIG. 4C) that is the (n+1)-th overlay mark in the device 400.

At operation 206, the method 200 (FIG. 2) performs an overlay measurement using the (n+1)-th overlay mark 408a and the n-th overlay mark 404a, and obtains a first overlay shift. This is also referred to as an after-development-inspection (ADI) in some embodiments. ADI may be performed using an overlay metrology tool that is operable to provide optical scan of the overlay marks 408a and 404a. For example, the overlay metrology tool may include a camera operable to scan and generate an image of the overlay marks 408a and 404a. The captured image is then analyzed to calculate the relative displacement of the overlay marks 408a and 404a. For example, the overlay marks 408a and 404a may be "box-in-box" marks where the overlay mark 404a is an outer box, and the overlay mark 408a an inner box. The overlay shift along the x-axis and y-axis can be individually determined by comparing the width of spacing between the two boxes.

In the present embodiment, operation 206 further provides an exposure-tool-induced overlay shift measured using the device 400. As discussed with respect to operation 204, the device 400 is pre-emptively applied with an estimate of the exposure-tool-induced overlay shift before the resist layer 408 is actually exposed. If the estimate of the exposure-tool-induced overlay shift matches the real exposure-tool-induced overlay shift, the overlay shift measured in operation 206 should be zero. Therefore, the real exposure-tool-induced overlay shift can be obtained by subtracting the first overlay shift from the estimate of the exposure-tool-induced overlay shift. The real exposure-tool-induced overlay shift may be provided to other wafer lots as one of the empirical process data when performing a similar fabrication process, such as forming a resist pattern over a stack of layers 402 through 406.

At operation 208, the method 200 (FIG. 2) checks the overlay shift measured in operation 206 against a threshold and decides if the resist pattern 408 needs re-work. The threshold may be set according to manufacturing rules based on a particular fabrication process and the particular layers 404 and 406. For example, a lower level metal interconnect may have a smaller tolerance of overlay shift than a higher level metal interconnect. In the present embodiment, if the overlay shift exceeds the threshold, the method 200 proceeds to operation 212 to perform re-work. Otherwise, the method 200 proceeds to operation 214, using the resist pattern 408 to perform further fabrication processes.

At operation 212, the method 200 (FIG. 2) performs a re-work process which includes removing the resist pattern 408 and forming a new resist layer over the layer 406. For example, the resist pattern 408 may be removed using a resist stripping process. For example, the new resist layer may be formed using spin-coating and pre-baking. With the new resist layer, the method 200 goes back to operation 204 and repeats the operations 204, 206, and 208, and possibly 212 again. In embodiments of the present disclosure, due to the overlay shift compensation applied in operation 204, the number of iterations through the re-work operation 212 is reduced.

Figure 4D:
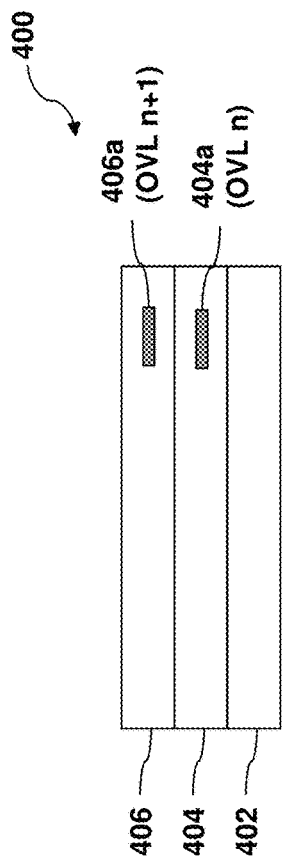

At operation 214, the method 200 (FIG. 2) performs one or more first manufacturing processes, thereby transferring the patterns from the resist pattern 408 to the layer 406, which includes transferring the overlay mark 408a to the layer 406, resulting in an overlay mark 406a (FIG. 4D). The overlay mark 406a is also the (n+1)-th overlay mark in the device 400. In an embodiment, the layer 406 is a metal layer and the overlay mark 406a comprises a metal such as copper, aluminum, or other suitable metals. In an embodiment, operation 214 includes etching the layer 406 using the resist pattern 408 or a derivative of the resist pattern 408 such as a hard mask pattern formed from the resist pattern 408. In an embodiment, operation 214 includes an etching process for forming via holes and another etching process for forming metal lines in a dual damascene process. In this embodiment, the overlay mark 408a may correspond to the via pattern or the line pattern. The resist pattern 408 is removed during or after the etching processes. After the layer 406 is etched to form via holes and/or line trenches, a metal may be deposited into the via holes and/or the line trenches, for example, by sputtering, plating, or other suitable deposition methods. Subsequent to the metal deposition, operation 214 performs a CMP process to remove excessive metal over the layer 406. The remaining metal becomes metal features embedded in the layer 406, including the overlay mark 406a. Ideally, the position, shape, and size of the overlay mark 406a should match the overlay mark 408a and stay aligned with the overlay mark 404a. In practice, however, the various fabrication processes above may introduce overlay shift. For example, etching and sputtering deposition may be asymmetrical across the wafer, and CMP may cause lateral movement of the overlay marks. In the present embodiment, the overlay shift caused by these processes will be properly accounted for during the next exposure process.

Figure 4E:
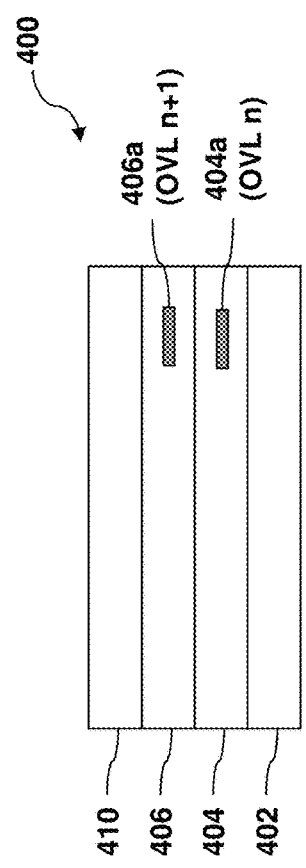

At operation 216, the method 200 (FIG. 3) performs one or more second manufacturing processes, including forming a layer 410 over the layer 406 (FIG. 4E). In an embodiment, the layer 410 is a dielectric layer or a low-k dielectric layer, similar to the layer 406. In an embodiment, operation 216 includes depositing an etch stop layer (not shown) over the layer 406, and depositing the layer 410 over the etch stop layer. In a further embodiment, operation 216 includes depositing one or more layers over the layer 410 in preparation for another resist exposing process. For example, the one or more layers may include a NFARC layer, a hard mask layer, and a resist under-layer such as an amorphous silicon layer. The various processes in operation 216 may also introduce changes in the overlay mark 406a.

At operation 218, the method 200 (FIG. 3) performs a second overlay measurement using the overlay marks 406a and 404a, and obtains a second overlay shift. In the present embodiment, operation 218 is substantially the same as operation 206 except that operation 218 measures a relative displacement between the overlay marks 406a and 404a, while operation 206 measures a relative displacement between the overlay marks 408a and 404a. In the present embodiment, operation 218 further calculates a difference between the first overlay shift (operation 206) and the second overlay shift (operation 218), which represents the total process-induced overlay shift by the first (operation 214) and second (operation 216) manufacturing processes. For example, operation 218 may subtract the first overlay shift from the second overlay shift and use the result as the total process-induced overlay shift by the first and second manufacturing processes.

Figure 4F:
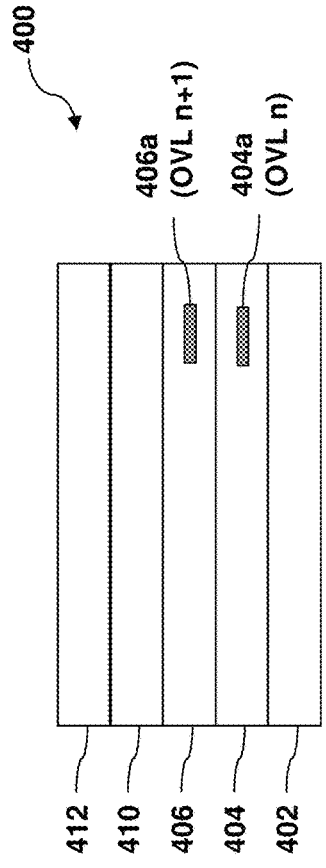
Figure 4G:
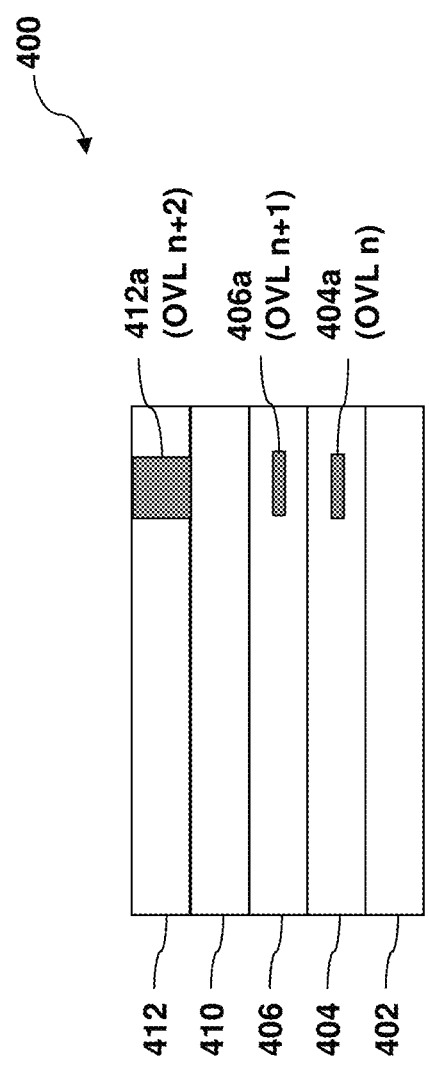

At operation 220, the method 200 (FIG. 3) forms a resist pattern 412 over the layer 410, wherein the resist pattern 412 has an overlay mark 412a (FIGS. 4F and 4G). The overlay mark 412a is the (n+2)-th overlay mark in the device 400. Operation 220 performs multiple processes as illustrated in FIGS. 4F and 4G. Referring to FIG. 4F, a resist layer 412 (not patterned yet) is formed over the layer 410 by one or more processes including resist coating and pre-baking in an embodiment. There may be one or more layers between the layer 410 and the resist layer 412 as discussed above. After the resist layer 412 is formed, the device 400 is placed in an exposure tool such as the lithography system 100 for exposing an image onto the resist layer 412. The exposure tool aligns a mask (e.g., the mask 106) with the device 400 so that an exposed image in the resist layer 412 will be properly aligned with features in the layer 406, particularly the overlay mark 412a in the exposed image will be properly aligned with the overlay mark 406a.

In the present embodiment, the lithography system 100, particularly the alignment sub-system 120, compensates the alignment between the mask 106 and the device 400 using an overlay compensation value. In the present embodiment, the overlay compensation value is a sum of several components. A first one of the components is the overlay compensation value applied to the resist pattern 408a when exposing the resist layer 408 (operation 204). For example, various layers of the device 400 correspond to various masks in a mask set. The alignment of the masks is defined with respect to a common reference in a base layer such as in the substrate 402. When the layer 406 has been compensated (through the use of the resist pattern 408), it is desirable to carry the same amount of overlay compensation to the subsequent layer 410 so that the layers 410 and 406 can be properly aligned. A second one of the components is the process-induced overlay shift discussed with respect to operation 218. Accounting for this overlay shift will reduce the number of repetitions of re-work, which will be discussed in operations 224/228. A third one of the components pre-emptively accounts for exposure-tool-induced overlay shift. For example, the exposure-tool-induced overlay shift may be obtained from other wafer lots that have undergone the same or substantially the same fabrication processes as the device 400, particularly when forming a resist pattern over the same stack of layers as the layers 402 through 410. Accounting for this overlay shift will reduce the number of repetitions of re-work, which will be discussed in operations 224/228.

It is noted that each of the three components may have translational, rotational, and dimensional sub-components, and each of the sub-components is directional. As a result, summing up the three components may end up increasing, decreasing, or canceling certain sub-component(s). For example, the first component may have a sub-component along the x-axis which is 2 nm shift to the right, the second component may have a sub-component along the x-axis which is 1 nm shift to the left, and the third component may have a sub-component along the x-axis which is 1 nm shift to the right (i.e, empirical data shows that the exposure tool will likely cause a 1 nm shift to the left along the x-axis). In this example, the net overlay compensation value along the x-axis is 2 nm to the right. In various embodiments, operation 220 may use one or multiple of the above components for calculating the overlay compensation value.

It is further noted that, in the present embodiment, only the third component is an estimate of what is going to happen when exposing the resist layer 412, while the first and second components are known values obtained from processing and measuring the device 400. Therefore, the overlay compensation value in operation 220 is optimized for the device 400 as much as possible. If the third component closely approximates the real exposure-tool-induced overlay shift, then the overlay marks 412a and 406a should properly align, reducing or minimizing the number of repetitions of re-work (operation 228).

After the mask and the device 400 are aligned, the resist layer 412 is exposed to have a latent image. Subsequently, the device 400 is moved to other tools to undergo processes such as a resist post-exposure bake process and a resist developing process. As a result, part of the resist layer 412 is removed and the remaining part of the resist layer 412 forms a resist pattern, which is referred to as the resist pattern 412 for the convenience of discussion. The resist pattern 412 includes the overlay mark 412a (FIG. 4G) that is the (n+2)-th overlay mark in the device 400.

At operation 222, the method 200 (FIG. 3) performs an overlay measurement using the (n+2)-th overlay mark 412a and the (n+1)-th overlay mark 406a, and obtains a third overlay shift. This is similar to operation 206. For example, operation 222 may be performed using an overlay metrology tool that is operable to capture images of the overlay marks 412a and 406a. The captured image is then analyzed to calculate the relative displacement of the overlay marks 412a and 406a. In the present embodiment, operation 222 further provides an exposure-tool-induced overlay shift measured using the device 400. As discussed with respect to operation 220, the device 400 is pre-emptively applied with an estimate of the exposure-tool-induced overlay shift before the resist layer 412 is actually exposed. If the estimate of the exposure-tool-induced overlay shift matches the real exposure-tool-induced overlay shift, the third overlay shift measured in operation 222 should be zero. Therefore, the real exposure-tool-induced overlay shift can be obtained by subtracting the third overlay shift from the estimate of the exposure-tool-induced overlay shift. The exposure-tool-induced overlay shift measured from the device 400 may be provided to other wafer lots as one of the empirical process data when performing a similar fabrication process, such as forming a resist pattern over a stack of layers 402 through 410.

At operation 224, the method 200 (FIG. 3) checks the overlay shift measured in operation 222 against a threshold and decides if the resist pattern 412 needs re-work. This is similar to operation 208. In the present embodiment, if the overlay shift exceeds the threshold, the method 200 proceeds to operation 228 to perform re-work. Otherwise, the method 200 proceeds to operation 230, using the resist pattern 412 to perform further fabrication processes. The re-work process in operation 228 is similar to what has been discussed in operation 212. In the present embodiment, the overlay compensation applied in 220 advantageously reduces the number of re-work processes 228.

At operation 230, the method 200 (FIG. 3) continues further processing to form a complete IC device. For example, the method 200 may etch the layer 410 using the resist pattern 412 or a derivative thereof, forming metal features in the layer 410, as well as other processes, as discussed in operations 214 through 220.

FIG. 5 shows a table 500 illustrating an example of overlay measurement and compensation performed by the method 200 in forming layers $L_1$, $L_2$, $L_3$, and $L_4$ in an IC device. The layers $L_1$ through $L_4$ contain four successive overlay marks and the layer $L_1$ is the base layer. Using the device 400 as an example, the layer 404 may be any of the layers $L_1$ through $L_4$, and the layer 406 is the layer above the layer 404. For example, if the layer 404 is the layer $L_2$, then the layer 406 is the layer $L_3$, and so on. Each row in table 500 corresponds to a respective layer, and has five columns. The first column contains a value $P_n$ which is the overlay compensation value applied in the previous layer. The second column contains a value $E_n$ which is the process-induced overlay shift in the current layer. The third column contains a value $F_n'$ which is the estimated exposure-tool-induced overlay shift. The fourth column contains a value $C_n$ which is the overlay compensation value applied in the current layer. The fifth column contains a value $F_n$ which is the measured (real) exposure-tool-induced overlay shift in the current layer.

For the base layer $L_1$, each of the values $P_1$, $E_1$, $F_1'$, $C_1$, and $F_1$ is zero because there is no overlay shift between $L_1$ and itself. For the layer $L_2$, the value $P_2$ is zero because there is overlay compensation applied to the layer $L_1$. The value $E_2$ is measured (see the discussion of operation 218) using overlay marks in the layers $L_2$ and $L_1$. The value $F_2'$ is estimated from other wafer lots (see the discussion of operations 204 and 220). The value $C_2$ equals to the sum of $P_2$, $E_2$, and $F_2'$(see the discussion of operation 220). Finally the value $F_2$ is derived from overlay measurements (see the discussion of operations 206 and 222).

For the layer $L_3$, the value $P_3$ takes the previous layer's overlay compensation value $C_2$ in the present embodiment, i.e., $P_3$ equals to $C_2$. In an alternative embodiment, the value $P_3$ takes a corrected value of the previous layer's overlay compensation by replacing the estimated exposure-tool-induced overlay shift $F_2'$ with the real exposure-tool-induced overlay shift $F_2$ in the compensation value. In other words, $P_3$ equals to the sum of $P_2$, $E_2$, and $F_2$ in this alternative embodiment. This provides even more accurate overlay compensation for the layer $L_3$. The rest of the values for the layers $L_3$ and $L_4$ are self-explanatory.

In an embodiment, various overlay compensation values are calculated using the alignment sub-system 120 of the lithography system 100 (FIG. 1). For example, the alignment sub-system 120 may include a computer or a computing system for calculating the overlay compensation discussed above, and further apply the overlay compensation to control the alignment between the mask 106 and the wafer 110. FIG. 6 illustrates a computing system 600 that may be included in the alignment sub-system 120. Referring to FIG. 6, the computing system 600 includes a microprocessor 602, an input device 604, a storage device 606, a video controller 608, a system memory 610, a display 614, and a communication device 616 all interconnected by one or more buses 612. The storage device 606 could be a floppy drive, hard drive, CD-ROM, optical drive, or any other form of storage device. In addition, the storage device 606 may be capable of receiving a floppy disk, CD-ROM, DVD-ROM, or any other form of computer-readable medium that may contain computer-executable instructions. The communication device 616 could be a modem, network card, or any other device to enable the computing system 600 to communicate with other nodes. It is understood that any computing system could represent a plurality of interconnected (whether by intranet or Internet) computing systems, including without limitation, personal computers, mainframes, and mobile computing devices. Further, the computing system 600 includes software for executing acts (typically machine-readable instructions) that produce a desired result. Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Although not intended to be limiting, one or more embodiments of the present disclosure provide many benefits to semiconductor fabrication processes. For example, embodiments of the present disclosure account for overlay shift induced by fabrication processes and by the exposure tool before performing a subsequent resist exposure process in the exposure tool. This advantageously reduces ADI overlay shift and reduces the number of re-works needed. Furthermore, overlay shift induced by fabrication processes and by the exposure tool are separately accounted for. The overlay shift induced by fabrication processes is measured using the currently processed wafer lot while the overlay shift induced by the exposure tool is estimated using other closely matched wafer lots. This further reduces ADI overlay shift and reduces the number of re-works needed.

In one exemplary aspect, the present disclosure is directed to a method for semiconductor fabrication. The method includes receiving a device having a first layer and a second layer over the first layer, the first layer having a first overlay mark. The method further includes forming a first resist pattern over the second layer, the first resist pattern having a second overlay mark. The method further includes performing a first overlay measurement using the second overlay mark in the first resist pattern and the first overlay mark; and performing one or more first manufacturing processes, thereby transferring the second overlay mark into the second layer and removing the first resist pattern. The method further includes performing one or more second manufacturing processes that include forming a third layer over the second layer. After the performing of the one or more second manufacturing processes, the method further includes performing a second overlay measurement using the second overlay mark in the second layer and the first overlay mark.

In another exemplary aspect, the present disclosure is directed to a method for semiconductor fabrication. The method includes receiving a device having a semiconductor substrate, a first layer over the semiconductor substrate, and a second layer over the first layer, the first layer having a first overlay mark. The method further includes forming a first resist pattern over the second layer using at least an exposure tool, the first resist pattern having a second overlay mark, wherein a position of the second overlay mark is adjusted by a first overlay compensation value when forming the first resist pattern. The method further includes performing a first overlay measurement using the second overlay mark in the first resist pattern and the first overlay mark; and performing one or more first manufacturing processes, thereby transferring the second overlay mark into the second layer and removing the first resist pattern. The method further includes performing one or more second manufacturing processes that include forming a third layer over the second layer. After the performing of the one or more second manufacturing processes, the method further includes performing a second overlay measurement using the second overlay mark in the second layer and the first overlay mark; and forming a second resist pattern over the third layer using at least the exposure tool. The second resist pattern has a third overlay mark, wherein a position of the third overlay mark is adjusted by a second overlay compensation value when forming the second resist pattern, and wherein the second overlay compensation value includes both a difference between results of the first and second overlay measurements and the first overlay compensation value.

In yet another exemplary aspect, the present disclosure is directed to a method for semiconductor fabrication. The method includes receiving a device having a semiconductor substrate, an n-th layer over the semiconductor substrate, and an (n+1)-th layer over the n-th layer, wherein n is a positive integer. The n-th layer has an n-th overlay mark. The method further includes forming an (n+1)-th resist pattern over the (n+1)-th layer using at least an exposure tool, the (n+1)-th resist pattern having an (n+1)-th overlay mark, wherein a position of the (n+1)-th overlay mark is adjusted by an n-th overlay compensation value when forming the (n+1)-th resist pattern. The method further includes performing a first n-th overlay measurement using the (n+1)-th overlay mark in the (n+1)-th resist pattern and the n-th overlay mark. The method further includes performing one or more first manufacturing processes, thereby transferring the (n+1)-th overlay mark from the (n+1)-th resist pattern into the (n+1)-th layer as a metallic (n+1)-th overlay mark and removing the (n+1)-th resist pattern. The method further includes performing one or more second manufacturing processes that include forming an (n+2)-th layer over the (n+1)-th layer. After the performing of the one or more second manufacturing processes, the method further includes performing a second n-th overlay measurement using the metallic (n+1)-th overlay mark and the n-th overlay mark; and forming an (n+2)-th resist pattern over the (n+2)-th layer using at least the exposure tool. The (n+2)-th resist pattern has an (n+2)-th overlay mark. A position of the (n+2)-th overlay mark is adjusted by an (n+1)-th overlay compensation value when forming the (n+2)-th resist pattern. The (n+1)-th overlay compensation value includes a difference between results of the first and second n-th overlay measurements, the n-th overlay compensation value, and an estimated exposure-tool-induced overlay shift.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor fabrication, comprising:
receiving a device having a first layer and a second layer over the first layer, the first layer having a first overlay mark;
forming a first resist pattern over the second layer, the first resist pattern having a second overlay mark;
performing a first overlay measurement using the second overlay mark in the first resist pattern and the first overlay mark;
performing one or more first manufacturing processes, thereby transferring the second overlay mark into the second layer and removing the first resist pattern;
performing one or more second manufacturing processes that include forming a third layer over the second layer; and
after the performing of the one or more second manufacturing processes, performing a second overlay measurement using the second overlay mark in the second layer and the first overlay mark.

2. The method of claim 1, further comprising:
forming a second resist pattern over the third layer, the second resist pattern having a third overlay mark, wherein a difference between results of the first and second overlay measurements is used for adjusting a position of the third overlay mark when forming the second resist pattern.

3. The method of claim 2, wherein an exposure-tool-induced overlay shift is also used for adjusting the position of the third overlay mark when forming the second resist pattern.

4. The method of claim 3, wherein the exposure-tool-induced overlay shift is measured during a process of manufacturing another device.

5. The method of claim 2, further comprising:
performing a third overlay measurement using the third overlay mark and the second overlay mark in the second layer.

6. The method of claim 5, on condition that an overlay shift from the third overlay measurement exceeds a threshold, further comprising:
performing a re-work process to form another resist pattern over the third layer.

7. The method of claim 1, wherein the first overlay mark comprises a metal.

8. The method of claim 1, wherein each of the first overlay mark and the second overlay mark in the second layer comprises a metal.

9. The method of claim 1, wherein the one or more first manufacturing processes include: a via etching process, a line etching process, a metal deposition process, a chemical mechanical planarization (CMP) process, or a combination thereof.

10. The method of claim 1, wherein the one or more second manufacturing processes include: a dielectric deposition process, an annealing process, or a combination thereof.

11. The method of claim 1, further comprising:
forming a second resist layer over the third layer;
placing the device in an exposure tool; and
adjusting a position of the device in the exposure tool using both a difference between results of the first and second overlay measurements and an exposure-tool-induced overlay shift obtained from another wafer lot.

12. A method for semiconductor fabrication, comprising:
receiving a device having a semiconductor substrate, a first layer over the semiconductor substrate, and a second layer over the first layer, the first layer having a first overlay mark;
forming a first resist pattern over the second layer using at least an exposure tool, the first resist pattern having a second overlay mark, wherein a position of the second overlay mark is adjusted by a first overlay compensation value when forming the first resist pattern;
performing a first overlay measurement using the second overlay mark in the first resist pattern and the first overlay mark;
performing one or more first manufacturing processes, thereby transferring the second overlay mark into the second layer and removing the first resist pattern;
performing one or more second manufacturing processes that include forming a third layer over the second layer;
after the performing of the one or more second manufacturing processes, performing a second overlay measurement using the second overlay mark in the second layer and the first overlay mark; and
forming a second resist pattern over the third layer using at least the exposure tool, the second resist pattern having a third overlay mark, wherein a position of the third overlay mark is adjusted by a second overlay compensation value when forming the second resist pattern, wherein the second overlay compensation value includes both a difference between results of the first and second overlay measurements and the first overlay compensation value.

13. The method of claim 12, wherein the second overlay compensation value further includes an estimated exposure-tool-induced overlay shift.

14. The method of claim 13, further comprising:
performing a third overlay measurement using the third overlay mark and the second overlay mark in the second layer.

15. The method of claim 14, further comprising:
deriving another exposure-tool-induced overlay shift by subtracting an overlay shift obtained from the third overlay measurement from the estimated exposure-tool-induced overlay shift.

16. The method of claim 12, wherein the one or more first manufacturing processes include: a via etching process, a line etching process, a metal deposition process, a chemical mechanical planarization (CMP) process, or a combination thereof.

17. The method of claim 12, wherein the one or more second manufacturing processes include: a dielectric deposition process, an annealing process, or a combination thereof.

18. A method for semiconductor fabrication, comprising:
receiving a device having a semiconductor substrate, an n-th layer over the semiconductor substrate, and an (n+1)-th layer over the n-th layer, the n-th layer having an n-th overlay mark, wherein n is a positive integer;
forming an (n+1)-th resist pattern over the (n+1)-th layer using at least an exposure tool, the (n+1)-th resist pattern having an (n+1)-th overlay mark, wherein a position of the (n+1)-th overlay mark is adjusted by an n-th overlay compensation value when forming the (n+1)-th resist pattern;

performing a first n-th overlay measurement using the (n+1)-th overlay mark in the (n+1)-th resist pattern and the n-th overlay mark;

performing one or more first manufacturing processes, thereby transferring the (n+1)-th overlay mark from the (n+1)-th resist pattern into the (n+1)-th layer as a metallic (n+1)-th overlay mark and removing the (n+1)-th resist pattern;

performing one or more second manufacturing processes that include forming an (n+2)-th layer over the (n+1)-th layer;

after the performing of the one or more second manufacturing processes, performing a second n-th overlay measurement using the metallic (n+1)-th overlay mark and the n-th overlay mark; and forming an (n+2)-th resist pattern over the (n+2)-th layer using at least the exposure tool, the (n+2)-th resist pattern having an (n+2)-th overlay mark, wherein a position of the (n+2)-th overlay mark is adjusted by an (n+1)-th overlay compensation value when forming the (n+2)-th resist pattern, wherein the (n+1)-th overlay compensation value includes a difference between results of the first and second n-th overlay measurements, the n-th overlay compensation value, and an estimated exposure-tool-induced overlay shift.

19. The method of claim 18, wherein the estimated exposure-tool-induced overlay shift is obtained from a process of forming a resist pattern on another device using the exposure tool.

20. The method of claim 18, further comprising:

performing an (n+1)-th overlay measurement using the (n+2)-th overlay mark and the metallic (n+1)-th overlay mark; and checking an overlay shift obtained from the (n+1)-th overlay measurement.

* * * * *